United States Patent [19]

Murray, Jr. et al.

[11] Patent Number: 4,639,858
[45] Date of Patent: Jan. 27, 1987

[54] APPARATUS AND METHOD FOR TESTING AND VERIFYING THE REFRESH LOGIC OF DYNAMIC MOS MEMORIES

[75] Inventors: Thomas L. Murray, Jr., Merrimack, N.H.; Thomas O. Holtey, Newton, Mass.

[73] Assignee: Honeywell Information Systems Inc., Waltham, Mass.

[21] Appl. No.: 510,711

[22] Filed: Jul. 5, 1983

[51] Int. Cl.[4] ..................... G06F 13/00; G11C 7/00
[52] U.S. Cl. .................................. 364/200; 364/900; 365/222
[58] Field of Search ... 364/200 MS File, 900 MS File; 365/222

[56] References Cited

U.S. PATENT DOCUMENTS

| | | | |
|---|---|---|---|
| 4,006,468 | 2/1977 | Webster | 364/900 |
| 4,142,233 | 2/1979 | Suzuki | 364/200 |
| 4,158,883 | 6/1979 | Kadono et al. | 364/200 |
| 4,204,254 | 5/1980 | Muzzani et al. | 364/200 |
| 4,317,169 | 2/1982 | Panepinto, Jr. et al. | 364/200 |
| 4,549,284 | 10/1985 | Ikuzaki | 365/222 |

Primary Examiner—Thomas M. Heckler
Assistant Examiner—Christina M. Eakman
Attorney, Agent, or Firm—George Grayson; John S. Solakian

[57] ABSTRACT

The refresh logic of a dynamic MOS memory subsystem of a data processing system is tested by providing apparatus for counting refresh cycles and generating a counter output signal in a first state after a predetermined number of refresh cycles. A microprocessor periodically tests the state of the counter output signal and keeps a count of the number of times the counter output signal was tested and found to be in a second state. When the microprocessor tests and finds the counter output signal in a first state, the microprocessor compares the number of times it tested and found the counter output signal in a second state and determines if that count is within a predetermined range for correct operation.

8 Claims, 3 Drawing Figures

APPARATUS AND METHOD FOR TESTING AND VERIFYING THE REFRESH LOGIC OF DYNAMIC MOS MEMORIES

RELATED APPLICATIONS

The following U.S. patent application filed on an even date with the instant application and assigned to the same assignee as the instant application is related to the instant application and is incorporated herein by reference.

"Apparatus and Method for Testing and Verifying the Timing Logic of a Cathode Ray Tube Display" by Thomas L. Murray, Jr., Kin C. Yu and Thomas O. Holtey, filed on July 5, 1983 and having U.S. Ser. No. 510,712, now U.S. Pat. No. 4,586,129.

BACKGROUND OF THE INVENTION

1. Field of the Invention

This invention relates to data processing systems and more particularly to apparatus for testing memory refresh logic.

2. Description of the Prior Art

Data processing systems include metal oxide semiconductor (MOS) dynamic random access memories. Information stored in MOS memories must be refreshed periodically, particularly in those address locations in which there is little activity. Failure of the refresh logic results in intermittent errors, the cause of which is difficult to determine.

A typical system is described in U.S. Pat. No. 4,317,169 entitled "Data Processing System Having Centralized Memory Refresh" which provides logic within the CPU to signal the MOS memory that a memory refresh operation can be performed. Logic in the MOS memory may either accept or discard the memory refresh signals that would refresh memory more frequently than required.

A technique for testing and verifying the operation of MOS memories is described in U.S. Pat. No. 4,359,771 entitled "Method and Apparatus for Testing and Verifying the Operation of Error Control Apparatus Within a Memory". Soft error rewrite control apparatus, in conjunction with error correction and detection (EDAC) circuits, writes corrected versions of the information read out from each location of a memory module at a predetermined rate.

Neither of these systems provides a means for verifying the refresh logic.

There is a need for data processing systems to have the means for readily testing the refresh logic of dynamic MOS memories. Improper operation of the refresh logic results in intermittent errors, the sources of which are difficult to locate.

OBJECTS OF THE INVENTION

Accordingly, it is a primary object of the invention to provide improved, low-cost apparatus for testing and verifying the refresh logic of a MOS dynamic memory system.

It is an object of the invention to provide apparatus for readily testing and verifying the refresh operation when the system is installed in an office environment.

SUMMARY OF THE INVENTION

A data processing system includes a central processing unit, an input/output microprocessor, a MOS main memory and a MOS input/output memory, all coupled in common to a system bus.

The CPU is interrupted to refresh a row of MOS memory every 32 microseconds. The number of refresh cycles are counted in a counter which generates a signal at logical ONE after 128 refresh cycles. The I/O microprocessor tests the signal every 12 microseconds and keeps a count of the number of tests in which the signal was at logical ZERO. The I/O microprocessor checks when the signal is a logical ONE that the count is between 340 and 345 indicating correct operation in that refresh cycles are occurring at the appropriate frequency.

BRIEF DESCRIPTION OF THE DRAWINGS

The novel features which are characteristic of the invention are set forth with particularity in the appended claims. The invention itself, however, both as to organization and operation may best be understood by reference to the following description in conjunction with the drawings in which:

DESCRIPTION OF THE PREFERRED EMBODIMENT

Figure 1:
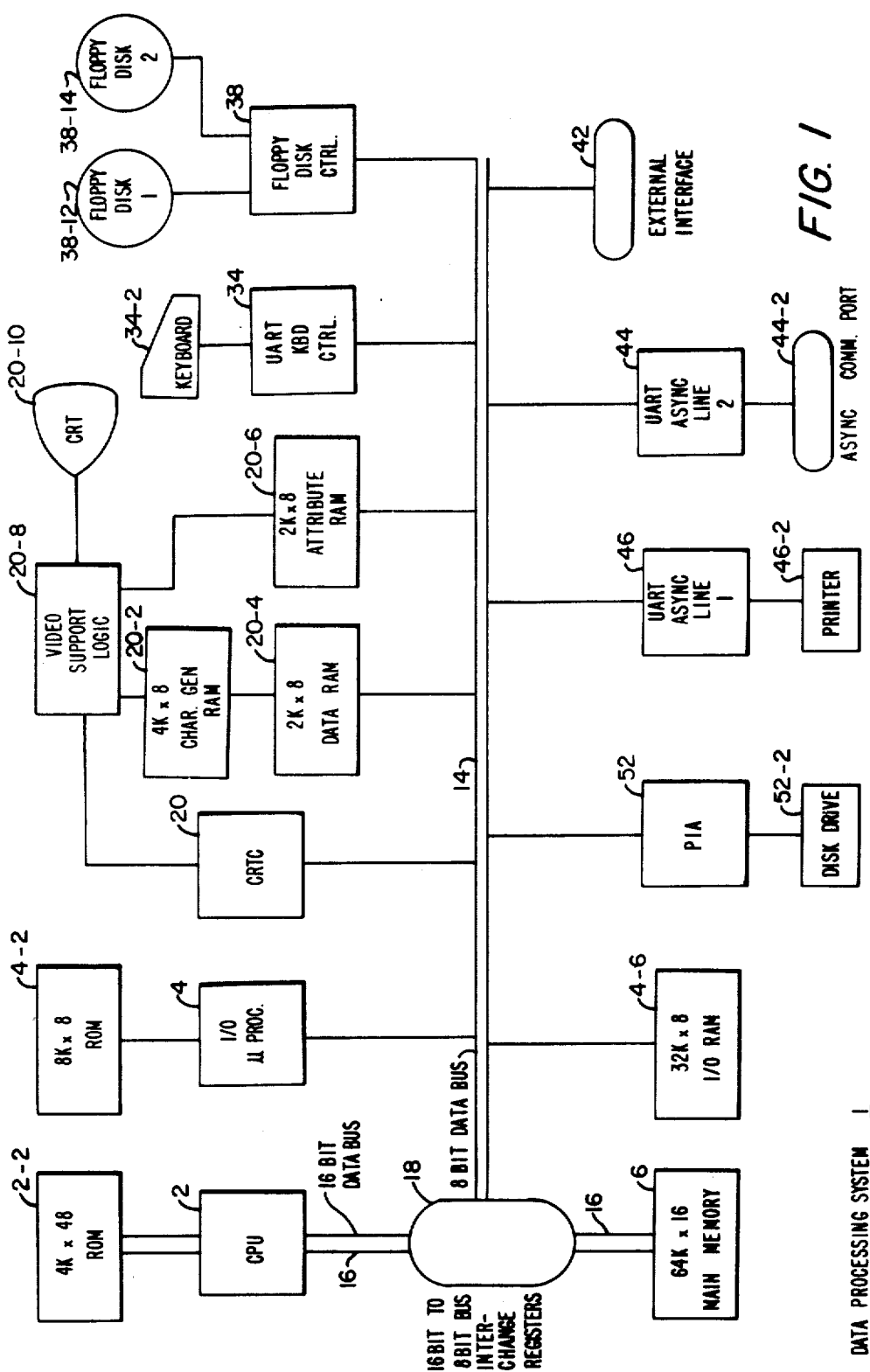
FIG. 1 shows a block diagram of the data processing system.

FIG. 1 is an overall diagram of a data processing system 1 which includes a firmware controlled central processor unit (CPU) 2 as an applications processor and a microprocessor 4 as an input/output processor.

Systems applications are performed by the CPU 2 executing software programs stored in a 64K by 16 bit word dynamic main memory 6. The microprograms used by the CPU 2 to execute the software instructions are stored in a 4K by 48 bit word read only memory 2-2.

Associated with microprocessor 4 are an 8K by 8 bit word read only memory (ROM) 4-2 and a 32K by 8 bit word dynamic random access memory (RAM) 4-6. The ROM 4-2 stores the firmware routines necessary for the start up and the initialization of the data processing system 1. The RAM 4-6 stores tables, communications control programs and firmware for emulating a universal asynchronous receive transmit controller (UART) 44, firmware for controlling a keyboard 34-2 by means of a UART 34, floppy disks by means of a floppy disk controller (FDC) 38, a printer 46-2 by means of a UART 46 and a cathode ray tube controller (CRTC) 20. The RAM 4-6 also includes a number of address locations, a "mailbox" which is used by the CPU 2 and microprocessor 4 to communicate with each other.

CPU 2 and main memory 6 transfer data between them over a 16 bit data bus 16 which is coupled to bus interchange registers 18. Also coupled to bus interchange registers 18 is an 8 bit data bus 14. Bus interchange registers 18 receives 16 bit data from the data bus 16 for transfer over data bus 14 as two 8 bit bytes; and also receives 8 bit bytes from data bus 14 for transfer over data bus 16. The microprocessor 4, RAM 4-6, CRTC 20, UART's 34, 44 and 46, and FDC 38 are all coupled in common to data bus 14.

Also coupled to data bus 14 are a peripheral interface adapter 52 for controlling a disk device 52-2, an asynchronous line UART 44 for receiving and transmitting data characters via an asynchronous port 44-2, a 2K by 8 bit word data random access memory (RAM) 20-4 for storing characters for display on a CRT 20-10 and a 2K by 8 bit word attribute random access memory (RAM) 20-6 for storing attribute characters. Attribute characters are used typically for such CRT 20-10 display functions as underlining characters or character fields or causing certain selected characters or character fields to blink or be displayed with higher intensity. Character codes stored in RAM 20-4 are applied to a 4K by 8 bit word character generator random access memory (RAM) 20-2 which generates the codes representative of the raster lines of data which display the characters on the face of the CRT 20-10. A video support logic 20-8 is coupled to the CRTC 20, character generator RAM 20-2 and attribute RAM 20-6 for generating the lines of characters on the face of the CRT 20-10.

The FDC 38 is typically an NEC μPD765 single-/double density floppy disk controller described in the NEC 1982 Catalog published by NEC Electronics USA Inc., Microcomputer Division, One Natick Executive Park, Natick, Mass. 01760.

The microprocessor 4 is typically a Motorola MC68B09 8 bit microprocessing unit. The PIA 52 is typically a Motorola MC68B21 peripheral interface adapter. The CRTC 20 is typically a Motorola MC68B45 CRT controller.

The microprocessor 4, PIA 52 and CRTC 20 are described in the Morotola Microprocessor Data Manual, copyright 1981 by Motorola Semiconductor Products Inc., 3501 Bluestein Blvd., Austin, Tex. 78721.

The UART's 34, 44 and 46 are typically Signetics 2661 Universal Asynchronous Receive Transmit Controllers described in the Signetics MOS Microprocessor Data Manual, copyright 1982 by Signetics Corporation, 811 East Arques Avenue, Sunnyvale, Calif. 94086.

Figure 2:
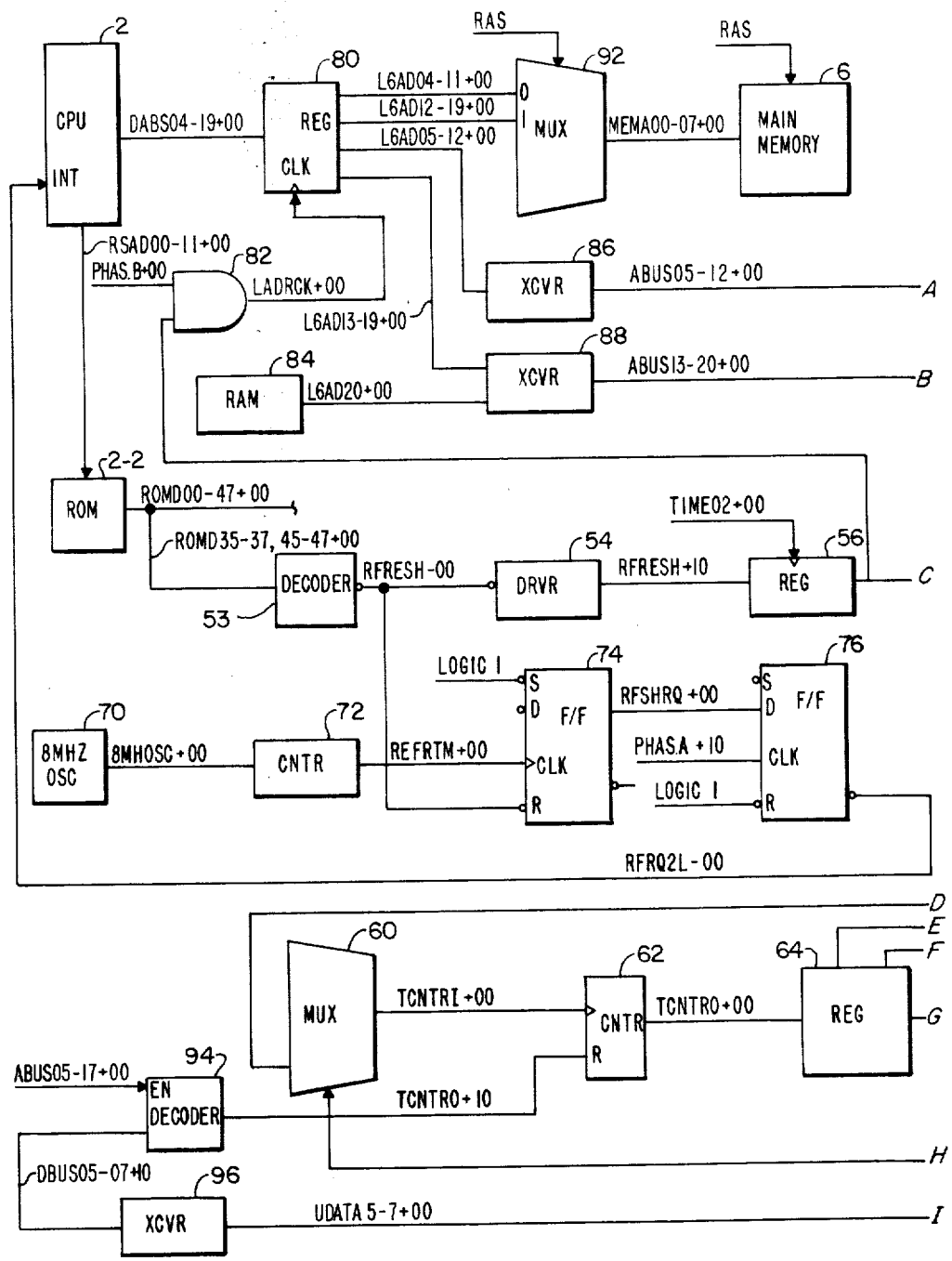
FIG. 2 shows the detailed logic associated with the refresh test and verification operation.
Figure 2:
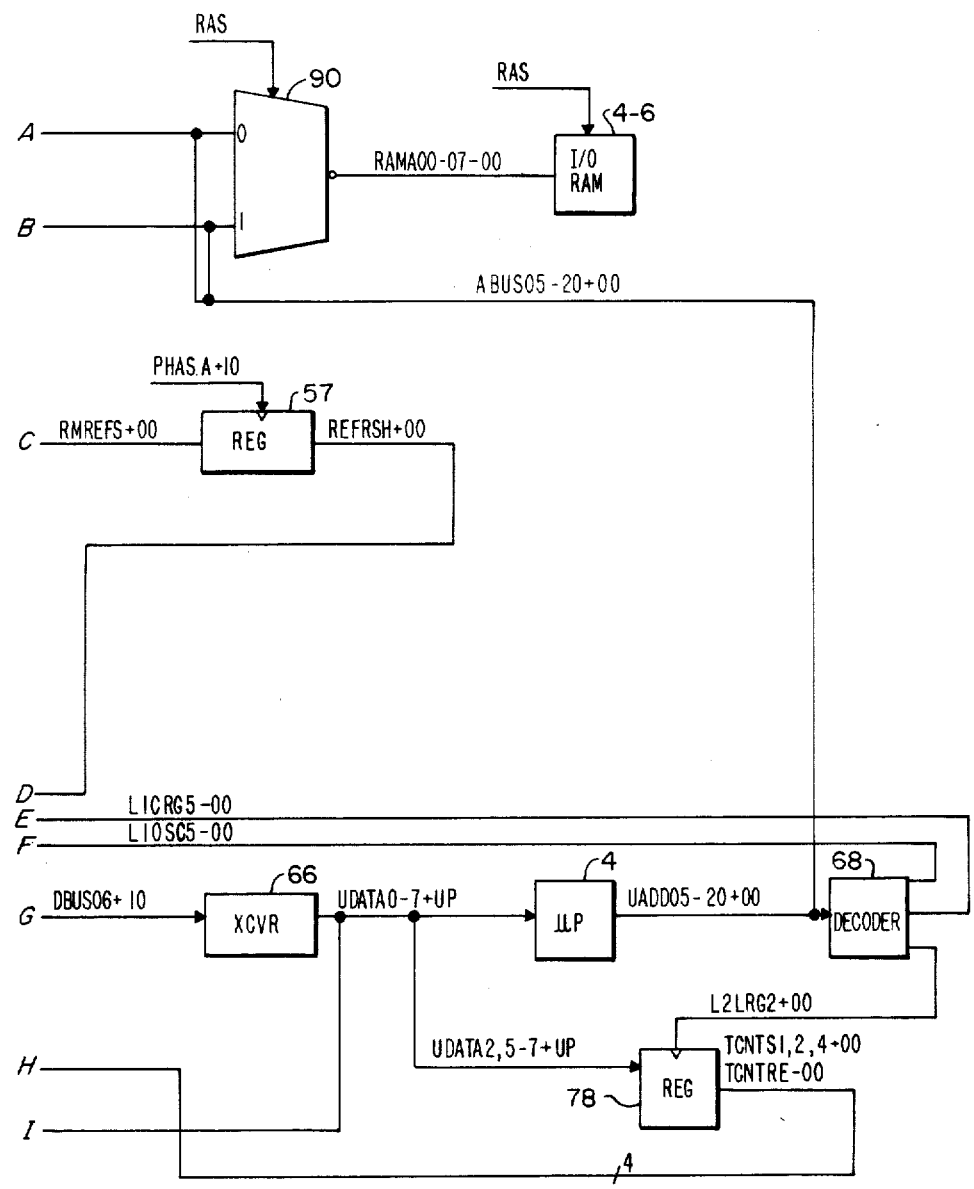

Referring to FIG. 2, main memory 6 and I/O RAM 4-6 are metal oxide semiconductor (MOS) random access memories. Each bit position is refreshed, that is, the charge representing a bit must be renewed periodically. Failure to refresh will result in the loss of data bits in those bit positions that are not frequently accessed during normal data processing. The loss of data bits occurs in a random pattern making detection difficult.

This invention provides apparatus for verifying the refresh logic by counting the number of refresh cycles occurring in a predetermined amount of time.

An 8 megahertz oscillator 70 generates an 8MHOSC+00 signal which is applied to a counter 72. Counter 72 divides the 8 MHz frequency by 256 to give a 32 microsecond cycle on output signal REFRTM+00. A flop 74 is set on the rise of the REFRTM+00 signal. Output signal RFSHRQ+00 from flop 74 is applied to the D terminal of a flop 76 which is set on the rise of timing signal PHAS.A+10. Output signal RFRQ2L-00 is forced to logical ZERO to interrupt CPU 2 to enable the CPU 2 to branch to a refresh cycle at the next CPU 2 cycle.

CPU 2 generates signal RSAD00+00 through RSAD11+00 to address ROM 2-2 to read out the first firmware word of the branch routine stored in ROM 2-2. Signals ROMD00-47+00 are read out from ROM 2-2. A decoder 53 is responsive to signals ROMD35+00 through ROMD37+00 and ROMD45+00 through ROMD47+00 to generate refresh signal RFRESH-00 thereby resetting flops 74 and 76.

Signal RFRESH-00 is inverted by a driver 54. Output signal RFRESH+10 from driver 54 is strobed into a register 56 by clock signal TIME02+00. Output signal RMREFS+00 from register 56 is strobed into a register 57 by clock signal PHAS.A+10 and output signal REFRSH+00 is applied to a multiplexer (MUX) 60.

The CPU 2 generates a row and column address over signals DABS04+00 through DABS19+00. Signal RMREFS+00 is applied to an AND gate 82 to generate signal LADRCK+00 at PHAS.B+00 time to strobe the Address signals DABS04+00 through DABS19+00 into a register 80.

There is a memory chip for each output bit of main memory 6 and for I/O RAM 4-6. Main memory 6 is made up of 16 chips and I/O RAM 4-6 is made up of 8 chips. Each chip is organized internally as a 256 bit by 256 bit matrix. Each bit position is identified by an 8 bit row address and an 8 bit column address. The refresh operation refreshes a row at a time. Therefore only 8 address signals are needed.

The RAS signal selects the row address selection signals. A MUX 92 therefore selects the 8 signals L6AD12+00 through L6AD19+00 to be applied to main memory 6 to select the row to be refreshed.

A MUX 90 selects row address signals ABUS13+00 through ABUS20+00 to generate row address signals RAMA00-00 through RAMA07-00 for refreshing the selected row. Refreshing of both main memory 6 and I/O RAM 4-6 is controlled by CPU 2.

Testing of this logic is accomplished as follows. The I/O microprocessor 4 is forced into a microprogram routine stored in ROM 4-2. The first microword of the microprogram results in I/O microprocessor 4 generating signals UADD05−20+00 which are applied to a decoder 68 to generate a signal L2LRG2+00. Signal L2LRG2+00 strobes data bus signals UDATA2+UP, and UDATA5+UP through UDATA7+UP into a register 78 thereby generating MUX enable signal TCNTRE−00, and MUX select signals TCNTS1+00, TCNTS2+00 and TCNTS4+00, respectively, which are applied to a MUX 60.

MUX 60 selects the refresh signal REFRSH+00 and generates signal TCNTRI+00. Signal REFRSH+00 cycles every 32 microseconds since CPU 2 is interrupted every 32 microseconds by signal RFRQ2L−00 from flop 76.

Counter 62 counts the number of transitions when signal REFRTM+00 goes from logical ONE to logical ZERO and generates signal TCNTR0+00 every 128 cycles.

The I/O microprocessor 4 tests signal TCNTR0+00 every 12 microseconds by forcing decoder 68 to generate signal L10SC5−00 to strobe signal TCNTR0+00 into a register 64 and to generate signal L1CRG5−00 to place the output signal DBUS06+10 on the data bus via a transceiver (XCVR) 66 to be tested by the I/O microprocessor 4.

Counter 62 is reset to binary ZERO under the firmware control of I/O microprocessor 4 through a decoder 94 which is enabled by address signals ABUS05+00 through ABUS17+00. Signals DBUS05+10 through DBUS07+10 are applied to decoder 94 from I/O microprocessor 4, signals UDATA05+00 through UDATA07+00 and XCVR 96.

The following are Boolean expressions for the signals generated by the I/O microprocessor 4 during the test and verification operation via the decoder 68.

$$L1CRG5-00 = \overline{(ABUS18+00)(ABUS17+00)(IOENBL-1A)}$$

$$\overline{(ABUS16+00)(ABUS15+00)(ABUS14+00)}$$

$$L1OSC5-00 = (ABUS17+00)(\overline{UOFFBS+00})(\overline{IOENBL-1A})$$

$$\overline{(ABUS16+00)(ABUS15+00)(ABUS14+00)}$$

$$(IOSTRB-00)$$

$$L2LRG2+00 = \overline{(ABUS18+00)(\overline{IOENBL-1A})(ABUS17+00)}$$

$$\overline{(ABUS16+00)(ABUS15+00)(ABUS14+00)}$$

$$(TIME23-00)$$

$$IOENBL-00 = (ABUS05+00)(ABUS06+00 \to ABUS12+00)$$

$$\overline{(REFRSH+00)((L6BSCY+00)+(U2MEM-00))}$$

$$\overline{(SYSCLR-00)}$$

Signal IOENBL−1A indicates that this is not an input/output data transfer operation.

Signal TIME23−00 times signal L2LRG2+00 to an oscillator, shown in copending related Application Ser. No. 510,712.

Clock signal IOSTRB−00 which is generated from signal TIME23−00 times signal L10SC5−00 to an oscillator, shown in copending related Application Ser. No. 510,712.

Signal L6BSCY+00 indicates a CPU 2 bus cycle.

Signal U2MEM−00 indicates that this is not an I/O microprocessor 4 to main memory 6 transfer.

Figure 3:
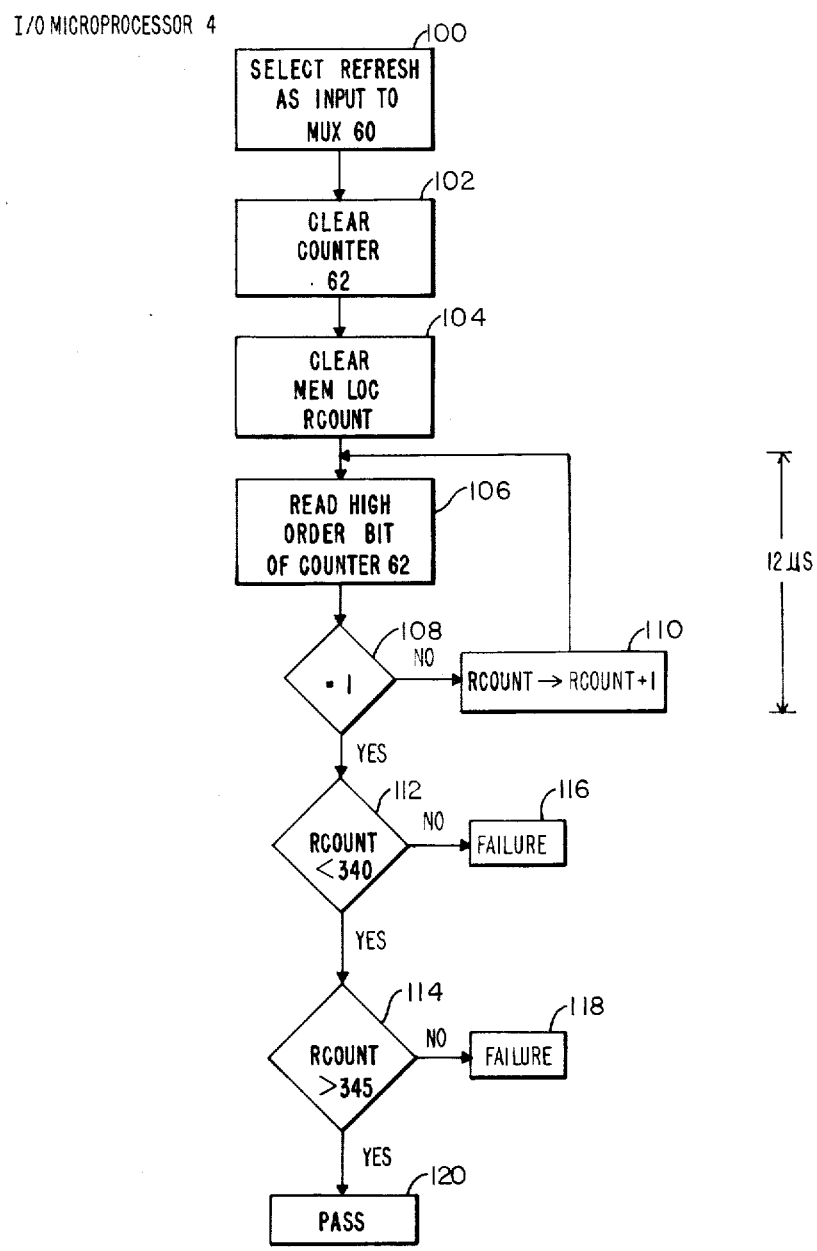
FIG. 3 shows a flow diagram of the refresh test and verification operation.

FIG. 3 is a flow diagram of the microprogram stored in ROM 4-2 and under the control of the I/O microprocessor 4 to verify the logic for performing the refresh operation.

In block 100 the I/O microprocessor 4 generates address signals UADR05+00 through UADR20+00 which are decoded in decoder 68 to generate the signal L2LRG2+00 which strobes data bus signals UDATA2+UP, and UDATA5+UP through UDATA7-+UP into register 78.

Output signal TCNTRE−00 enables MUX 60 and select signals TCNTS1+00, TCNTS2+00 and TCNTS4+00 select the refresh signal REFRSH+00 which is applied to MUX 60. The MUX 60 output signal is applied to counter 62.

In block 102 counter 62 is cleared by signal TCNTRC+10 which is generated by data bus signals DBUS05+10 through DBUS07+10 applied to decoder 94. Decoder 94 is enabled by signals ABUS05+00 through ABUS17+00.

I/O microprocessor 4 in block 104 clears a memory location in I/O RAM 104 to ZERO. The memory location has a mnemonic of RCOUNT in the firmware.

I/O microprocessor 4 in block 106 applies address bus signals UADR05+00 through UADR20+to decoder 68 to generate signals L10SC5−00 and L1CRG5−00 to store the state of counter 62 output signal TCNTR0+00. The register 64 output signal DBUS06+10 is received by the I/O microprocessor 4.

In block 108 I/O microprocessor 4 tests signal DBUS06+10, branches to block 110 if the signal is at logical ZERO or branches to block 112 if the signal is at logical ONE.

In block 110 I/O microprocessor 4 increments RCOUNT and returns to block 106. The loop, blocks 106, 108 and 110 back to 106, takes 12 microseconds.

Counter 62 receives a negative-going refresh signal REFRSH+00 every 32 microseconds. Counter 62 generates output signal TCNTR0+00 after receiving 128 negative-going signals or after 4096 microseconds (128×32 microseconds). The firmware loop takes 12 microseconds; therefore RCOUNT should store 342 approximately (4096 divided by 12) if the refresh logic operates correctly.

When the I/O microprocessor 4 in block 108 finds that signal TCNTR0+00 is at logical ONE, it branches to block 112 where I/O microprocessor 4 tests the contents of RCOUNT. If RCOUNT is less than 340 indicating a logic failure, then I/O microprocessor 4 branches to block 116. If RCOUNT is equal to or greater than 340, then I/O microprocessor 4 branches to block 114.

In block 114 I/O microprocessor 4 tests if RCOUNT is greater than 345. If RCOUNT is greater than 345, then I/O microprocessor 4 branches to block 118 indicating a logic failure. If RCOUNT is equal to or less than 345, then I/O microprocessor 4 branches to block 120 indicating correct logic operation. The reason for the range between 340 and 345 is to take care of any differences in time between the CPU 2 responding to the first interrupt and the I/O microprocessor 4 starting to process block 108.

Having shown and described a preferred embodiment of the invention, those skilled in the art will realize that many variations and modifications may be made to affect the described invention and still be within the scope of the claimed invention. Thus, many of the elements indicated above may be altered or replaced by different elements which will provide the same result and fall within the spirit of the claimed invention. It is the intention, therefore, to limit the invention only as indicated by the scope of the claims.

What is claimed is:

1. A data processing system includes a plurality of metal oxide semiconductor (MOS) dynamic random access memories, each of said plurality of MOS dynamic random access memories having a plurality of MOS chips, each of said plurality of MOS chips storing a plurality of binary bits, each of said binary bits being identified by a row address and a column address, said system further including apparatus for testing and verifying logic which refreshes bit positions of said plurality of MOS chips, said apparatus comprising:

timing means for generating an interrupt signal which cycles between a first and a second state at a predetermined rate;

central processor unit (CPU) means having first means responsive to said interrupt signal at each said first state for generating a plurality of row address signals applied to the plurality of MOS chips for refreshing said bit positions of said plurality of MOS chips, and said CPU means having second means responsive to said interrupt signal at each said first state for generating a refresh signal;

microprocessor means including third means for counting the number of times said refresh signal is generated and generating a refresh count signal in a first state after counting a first predetermined number of said refresh signals;

said microprocessor means further including fourth means coupled to said third means for testing said refresh count signal to determine if it is in said first or a second state and fifth means coupled to said fourth means for storing a test count of the number of times said refresh count signal was in the second state when tested by said fourth means;

said microprocessor means further including sixth means coupled to said third means for comparing said test count with a second predetermined number, and including seventh means coupled to said sixth means for comparing said test count with a third predetermined number, and eighth means coupled to said sixth and said seventh means for indicating a failure when said test count is less than said second predetermined number or greater than said third predetermined number.

2. The apparatus of claim 1 wherein said timing means comprises:

an oscillator for generating a first output signal having a first predetermined frequency;

a counter for receiving said first output signal and generating a second output signal having a second predetermined frequency wherein said second predetermined frequency equals said first predetermined frequency divided by an integer N;

a first flop for storing said second output signal and generating a third output signal in a first state; and a second flop responsive to said third output signal in said first state for generating said interrupt signal in said first state;

said first flop being responsive to said refresh signal for generating said third output signal in a second state;

said second flop being responsive to said third output signal in said second state for generating said interrupt signal in said second state.

3. The apparatus of claim 2 wherein said second means comprises:

a read only memory means responsive to a plurality of ROM address signals from the CPU for reading out a plurality of first microword signals; and first decoder means responsive to selective ones of said plurality of first microword signals for generating said refresh signal.

4. The apparatus of claim 3 wherein said third means comprises:

second decoder means responsive to a first plurality of selective address signals from a microprocessor unit in said microprocessor means for generating a first decoder signal;

first register means responsive to said first decoder signal and a first plurality of selective data signals from said microprocessor unit for generating a plurality of multiplexer (MUX) select signals and a MUX enable signal;

multiplexer means responsive to said plurality of MUX select signals, said MUX enable signal for selecting said refresh signal;

counter means for receiving said refresh signal from said multiplexer and for counting transitions of said refresh signal in said first state to said refresh signal in said second state and generating said refresh count signal in said first state after receiving said first predetermined number of said transitions;

said second decoder means being responsive to a second plurality of address signals from said microprocessor unit for generating a register load signal and responsive to a third plurality of address signals for generating a register output signal; and register means responsive to said register load signal for storing said refresh count signal, and responsive to said register output signal for transferring said count signal to said refresh microprocessor unit.

5. The apparatus of claim 1 wherein said predetermined rate is a 32 microsecond cycle.

6. The apparatus of claim 1 wherein said first predetermined number is 128.

7. The apparatus of claim 1 wherein said second predetermined number is 340 and said third predetermined number is 345.

8. The apparatus of claim 2 wherein said first predetermined frequency is 8 megahertz and said second predetermined frequency is 0.03125 megahertz and N=256.

* * * * *